(12) United States Patent
Chand et al.

(10) Patent No.: US 12,741,863 B2
(45) Date of Patent: Sep. 22, 2026

(54) MICROELECTROMECHANICAL SYSTEMS PACKAGE WITH A LATERAL VENT HOLE CONNECTED TO A CAVITY AND METHOD FOR MANUFACTURING THE SAME

(71) Applicant: Vanguard International Semiconductor Corporation, Hsinchu (TW)

(72) Inventors: Rakesh Chand, Singapore (SG); Ramachandramurthy Pradeep Yelehanka, Singapore (SG); Sock Kuan Soo, Singapore (SG); Poh Liang Yap, Singapore (SG); Guofu Zhou, Singapore (SG)

(73) Assignee: Vanguard International Semiconductor Corporation, Hsinchu (TW)

( * ) Notice: Subject to any disclaimer, the term of this patent is extended or adjusted under 35 U.S.C. 154(b) by 759 days.

(21) Appl. No.: 17/942,193

(22) Filed: Sep. 12, 2022

(65) Prior Publication Data

US 2024/0083743 A1 Mar. 14, 2024

(51) Int. Cl.
*B81B 7/00* (2006.01)
*B81C 1/00* (2006.01)
(Continued)

(52) U.S. Cl.
CPC .......... *B81B 7/0041* (2013.01); *B81B 7/0006* (2013.01); *B81C 1/00293* (2013.01);
(Continued)

(58) Field of Classification Search
CPC ... B81B 7/0035; B81B 7/0041; B81B 3/0021; B81B 2203/0145; B81B 2203/0154;
(Continued)

(56) References Cited

U.S. PATENT DOCUMENTS

2014/0227816 A1* 8/2014 Zhang .................... H01L 21/56 438/48
2015/0375994 A1* 12/2015 Chien ................ B81C 1/00238 257/43
(Continued)

FOREIGN PATENT DOCUMENTS

CN 111439721 A 7/2020
TW 201343533 A 11/2013
(Continued)

*Primary Examiner* — Jesse Y Miyoshi
(74) *Attorney, Agent, or Firm* — Winston Hsu

(57) ABSTRACT

A microelectromechanical systems (MEMS) package includes a first MEMS package and a second MEMS package laterally spaced apart from the first MEMS package. The first MEMS package includes a first device substrate including a first MEMS device, a first cap substrate bonded to the first device substrate, where the first cap substrate encloses a first cavity and a vent hole connected to the first cavity. A first sealing layer is filled in the vent hole, where the first sealing layer is disposed between the first device substrate and the first cap substrate. The second MEMS package includes a second device substrate including a second MEMS device and a second cap substrate. The second cap substrate is bonded to the second device substrate and encloses a second cavity. The first cavity has a first pressure, and the second cavity have a second pressure different from the first pressure.

16 Claims, 10 Drawing Sheets

(51) Int. Cl.
*G01C 19/5769* (2012.01)
*G01P 15/08* (2006.01)

(52) U.S. Cl.
CPC ...... *G01C 19/5769* (2013.01); *G01P 15/0802* (2013.01); *B81B 2201/0235* (2013.01); *B81B 2201/0242* (2013.01)

(58) Field of Classification Search
CPC .... B81B 2203/0163; B81B 2203/0172; B81C 1/00277; B81C 1/00293; B81C 1/00134; B81C 1/00142; B81C 1/0015; B81C 1/00158; B81C 1/00198; B81C 2203/019; B81C 2203/0172; B81C 2203/0127; B81C 2203/0109
See application file for complete search history.

(56) References Cited

U.S. PATENT DOCUMENTS

2016/0244325 A1* 8/2016 Cheng ................. B81C 1/00293
2016/0332867 A1* 11/2016 Tseng ................. B81C 1/00293

FOREIGN PATENT DOCUMENTS

TW 201641415 A 12/2016
TW 201714818 A 5/2017

* cited by examiner 220
402
D2
454
422b
120
D3
422c
452
422a
D1
220
404
130b
122b
130b
424
130a
122a
130a
210
X
Z
Y 452b(452)
120a
426
424
122a
128
130a
452d(452)
452a(452)
452c(452)

X
Y
Z

MICROELECTROMECHANICAL SYSTEMS PACKAGE WITH A LATERAL VENT HOLE CONNECTED TO A CAVITY AND METHOD FOR MANUFACTURING THE SAME

BACKGROUND OF THE INVENTION

1. Field of the Invention

The present disclosure relates generally to microelectromechanical systems (MEMS) packages and methods for manufacturing the same.

2. Description of the Prior Art

Microelectromechanical systems (MEMS) devices, such as accelerometers, gyroscopes, pressure sensors, and microphones, have found widespread use in many modern electronic devices. For example, inertial measurement units (IMU) composed of accelerometers and/or MEMS gyroscopes are commonly found in tablet computers, automobiles, or smartphones. For some applications, various MEMS devices need to be integrated into one MEMS package. However, for MEMS devices requiring different pressures, these MEMS devices need to be packaged separately at different ambient pressure and then integrated into one MEMS package. Therefore, the whole packaging process is complicated and the MEMS package has large footprint.

SUMMARY OF THE INVENTION

In view of this, the present disclosure provides microelectromechanical systems (MEMS) packages and manufacturing methods thereof in order to overcome the drawbacks in the prior art.

In some embodiments of the present disclosure, a MEMS package includes a first MEMS package and a second MEMS package laterally spaced apart from the first MEMS package. The first MEMS package includes a first device substrate including a first MEMS device, a first cap substrate bonded to the first device substrate, where the first cap substrate encloses a first cavity and a vent hole connected to the first cavity. A first sealing layer is filled in the vent hole, where the first sealing layer is disposed between the first device substrate and the first cap substrate. The second MEMS package includes a second device substrate including a second MEMS device and a second cap substrate. The second cap substrate is bonded to the second device substrate and encloses a second cavity. The first cavity has a first pressure, and the second cavity have a second pressure different from the first pressure.

In some embodiments of the present disclosure, a method of manufacturing a MEMS package includes: providing a cap substrate including a first recess, a second recess, and a third recess, the first recess being connected to the third recess, and the first and third recesses being laterally spaced apart from the second recess, where the depths of the first and second recesses are greater than a depth of the third recess; covering the first recess, the second recess, and the third recess with a cap substrate at an ambient pressure to form a first cavity, a second cavity, and a third cavity; removing the cap substrate abutting an end of the third recess to form a vent hole; flowing a gas through the vent hole at another ambient pressure different from the ambient pressure; and filling a sealing layer into the vent hole after flowing a gas through the vent hole.

According to some embodiments of the present disclosure, the pressure of the first cavity can be controlled independent of the pressure of the second cavity. Besides, the pressure of the first cavity can be controlled by flowing a gas through the vent hole. Therefore, the whole packaging process is simplified and the footprint of the MEMS package is small compared with those of the prior art.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
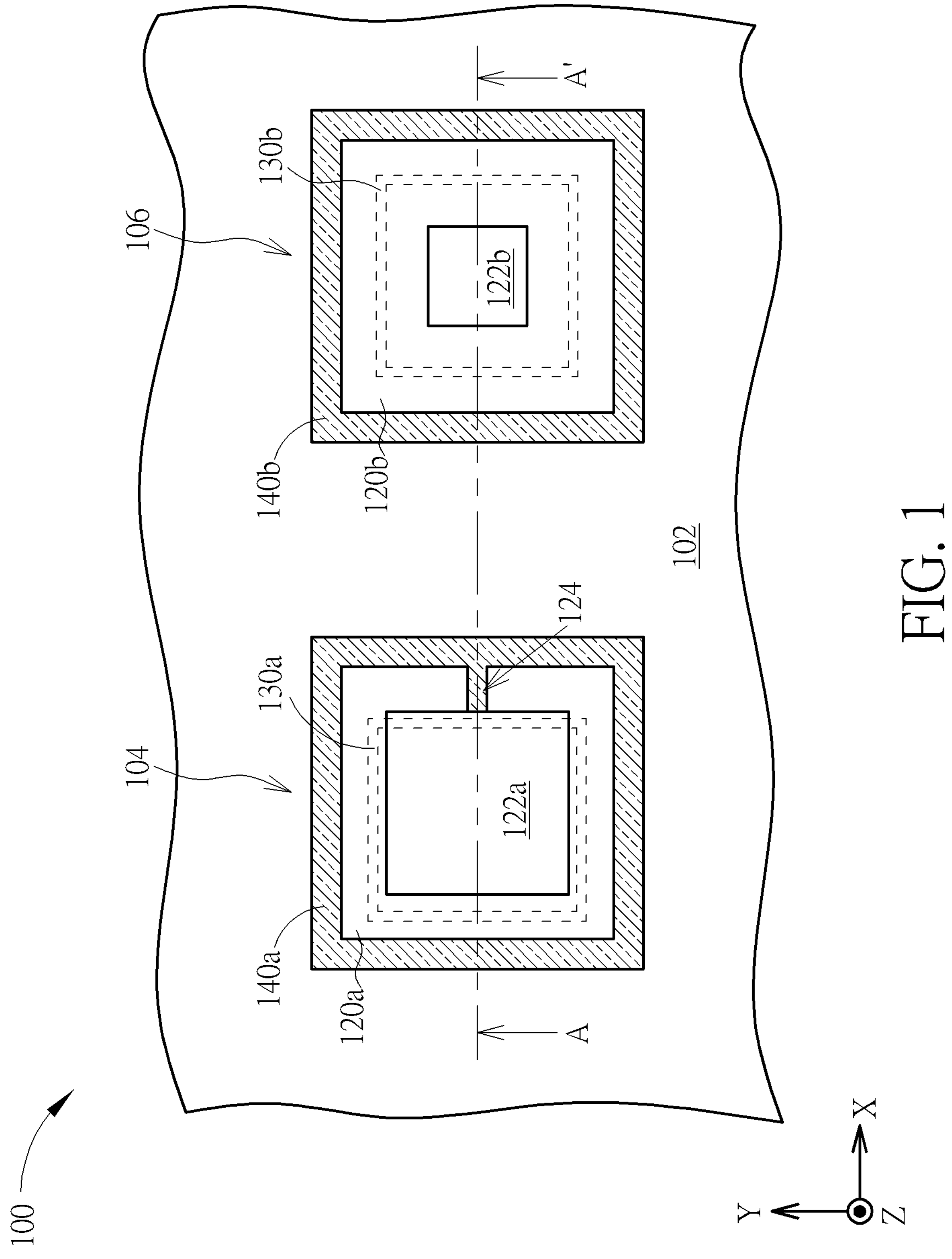
FIG. 1 is a schematic top view of a microelectromechanical systems (MEMS) package according to some embodiments of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “under,” “lower,” “over,” “above,” “on,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. For example, if the device in the figures is turned over, elements described as “below” and/or “beneath” other elements or features would then be oriented “above” and/or “over” the other elements or features. The apparatus may be otherwise oriented (rotated 90 degrees or at other orientations) and the spatially relative descriptors used herein may likewise be interpreted accordingly.

It is understood that, although the terms first, second, third, etc. may be used herein to describe various elements, components, regions, layers and/or sections, these elements, components, regions, layers and/or sections should not be limited by these terms. These terms may be only used to distinguish one element, component, region, layer and/or section from another region, layer and/or section. Terms such as "first," "second," and other numerical terms when used herein do not imply a sequence or order unless clearly indicated by the context. Thus, a first element, component, region, layer and/or section discussed below could be termed a second element, component, region, layer and/or section without departing from the teachings of the embodiments.

As disclosed herein, the term "about" or "substantial" generally means within 20%, 10%, 5%, 3%, 2%, 1%, or 0.5% of a given value or range. Unless otherwise expressly specified, all of the numerical ranges, amounts, values and percentages disclosed herein should be understood as modified in all instances by the term "about" or "substantial". Accordingly, unless indicated to the contrary, the numerical parameters set forth in the present disclosure and attached claims are approximations that can vary as desired.

Furthermore, as disclosed herein, the terms "coupled to" and "electrically connected to" include any directly and indirectly electrical connecting means. Therefore, if it is described in this document that a first component is coupled or electrically connected to a second component, it means that the first component may be directly connected to the second component, or may be indirectly connected to the second component through other components or other connecting means.

Although the disclosure is described with respect to specific embodiments, the principles of the disclosure, as defined by the claims appended herein, can obviously be applied beyond the specifically described embodiments of the disclosure described herein. Moreover, in the description of the present disclosure, certain details have been left out in order to not obscure the inventive aspects of the disclosure. The details left out are within the knowledge of a person having ordinary skill in the art.

FIG. 1 is a schematic top view of a microelectromechanical systems (MEMS) package according to some embodiments of the present disclosure. Refereeing to FIG. 1, a MEMS package 100 includes MEMS devices such as an accelerometer or a gyroscope, but not limited thereto. In some embodiments, the MEMS package 100 includes a base substrate 102, and at least two sub-MEMS packages, such as a first MEMS package 104 and a second MEMS package 106, are disposed on a same base substrate 102, and the first MEMS package 104 and the second MEMS package 106 are laterally (e.g. in an x-direction) spaced apart from each other.

The first MEMS package 104 includes a first MEMS device (not shown), a first cap substrate 120*a*, a first cavity 122*a*, a vent hole 124, and a first sealing layer 140*a*. The first MEMS device overlaps the first cavity 122*a*, and at least a portion of the first MEMS device, such as a proof mass or suspension beam, can move, vibrate and/or rotate in a space constituted by the first cavity 122*a* during the operation of the first MEMS package 104. The first cavity 122*a* is enclosed by the first cap substrate 120*a* and the first sealing layer 140*a*. In some embodiments, the first cavity 122*a* has a predetermined pressure (e.g. a first pressure). The vent hole 124 is connected to a sidewall of the first cavity 122*a*, and the vent hole 124 includes a straight channel laterally passing through the first cap substrate 120*a*. At least a portion of the vent hole 124 is filled with the first sealing layer 140*a*.

In some embodiments, the first MEMS package 104 further includes a first device substrate (not shown) disposed under the first cap substrate 120*a* and the first cavity 122*a* in a vertical direction (e.g. in a Z-direction). The first device substrate includes a protrusion 130*a* which is a continuous structure extending downward from a bulk of the first device substrate and bonded to the base substrate 102. A portion of the protrusion 130*a* overlaps the first cavity 122*a* and is laterally (e.g. in an x-direction) spaced apart from the first vent hole 124.

Referring to FIG. 1, the second MEMS package 106 includes a second MEMS device (not shown), a second cap substrate 120*b*, a second cavity 122*b*, and a second sealing layer 140*b*. The second MEMS device overlaps the second cavity 122*a*, and at least a portion of the second MEMS device, such as a proof mass or suspension beam, can move, vibrate and/or rotate in a space constituted by the second cavity 122*b* during the operation of the second MEMS package 106. The second cavity 122*b* is enclosed by the second cap substrate 120*b* and the second sealing layer 140*b*. In some embodiments, the second cavity 122*b* has a predetermined pressure (e.g. a second pressure). The second MEMS package 106 further includes a second device substrate (not shown) disposed under the second cap substrate 120*b* and the second cavity 122*b*. The second device substrate include a protrusion 130*b* which is a continuous structure extending downward from a bulk of the second device substrate and bonded to the base substrate 102. The protrusion 130*b* surrounds the periphery of the second cavity 122*b*, so the protrusion 130*b* does not overlap the second cavity 122*b* when viewed from a top down perspective.

Figure 2:
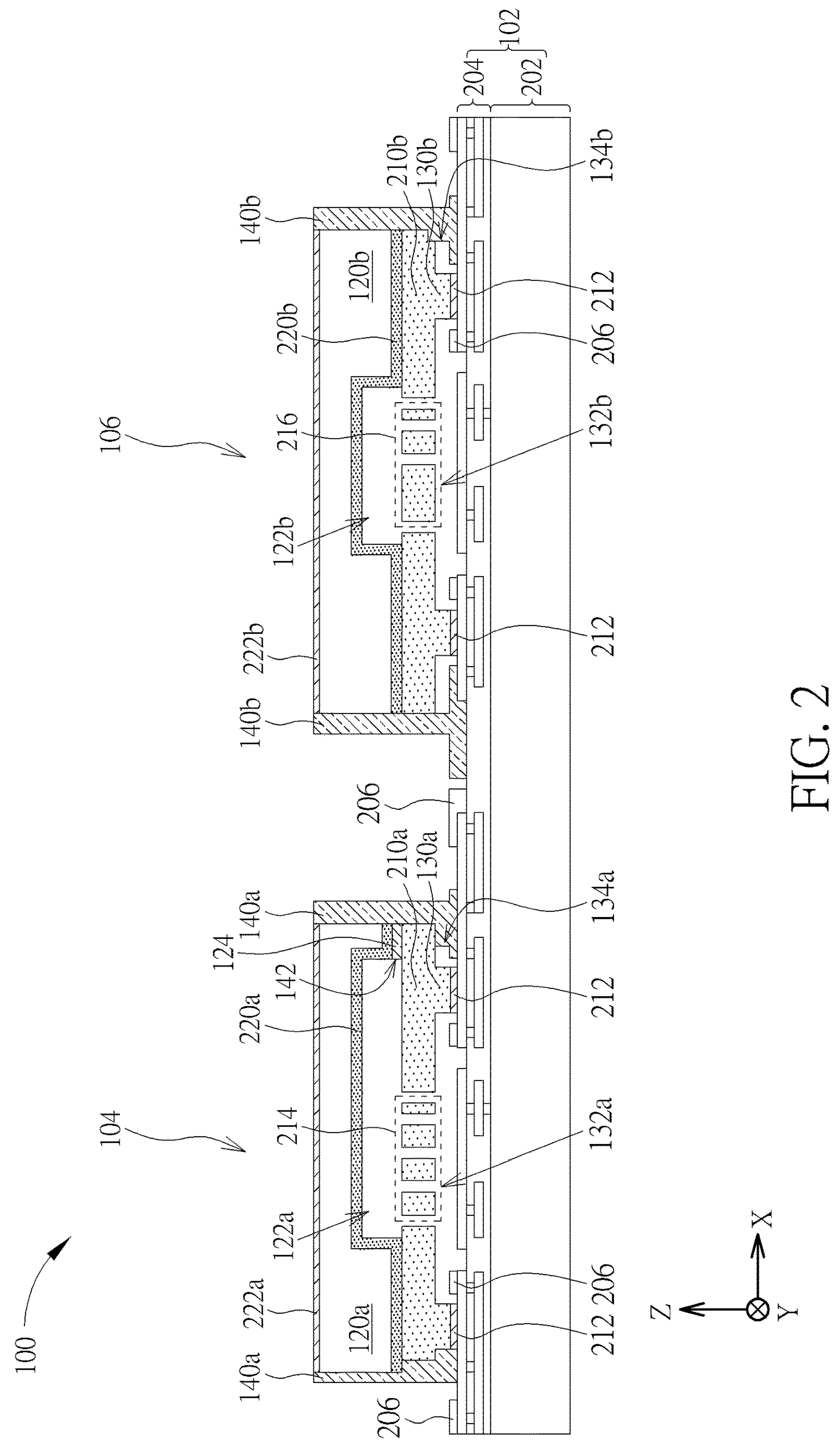
FIG. 2 is a schematic cross-sectional view of a MEMS package taken along line A-A' in FIG. 1 according to some embodiments of the present disclosure.

FIG. 2 is a schematic cross-sectional view of a MEMS package taken along line A-A' in FIG. 1 according to some embodiments of the present disclosure. Referring to FIG. 2, the first MEMS package 104 and the second MEMS package 104 share the same base substrate 102. The base substrate 102 include a supporting substrate 202 and an interconnect layer 204 disposed on the supporting substrate 202. In some embodiments, the supporting substrate 202 is a semiconductor substrate used to accommodate semiconductor devices such as transistors, but not limited thereto. In some embodiments, the supporting substrate 202 can be an insulating substrate without any active or passive devices. The interconnect layer 204 includes layers of inter metal dielectric (IMD) and a plurality of conductive interconnect lines and vias. The conductive interconnect lines and vias have a predetermined design layout, and can be electrically coupled to the first MEMS device 212 and the second MEMS device 216 disposed over the interconnect layer 204. A protection layer 206 can be disposed on the interconnect layer 204 to protect portions of the interconnect layer 204.

In some embodiments, the first device substrate 210*a* includes the first MEMS device 214 such has an accelerometer or a gyroscope. The first device substrate 210*a* can be bonded to the base substrate 102 by a bonding material 212 disposed under the protrusion 130*a*. The bonding material 212 can include eutectic bonding material including Au—Ge, Au—Si, Al—Ge, Al—Si or a combination thereof, but not limited thereto. A first lower cavity 132*a* can be defined by the protrusion 130*a*, which is disposed under the first MEMS device 214 and surrounded by the protrusion 130*a*.

In some embodiments, the first cap substrate 120*a* is disposed over the first device substrate 210*a*. In some embodiments, the first cap substrate 120*a* can be bonded to the first device substrate 210*a* by a bonding dielectric layer 220*a* disposed on the surface of the first cap substrate 120*a*. The bonding dielectric layer 220*a* can be a conformal layer disposed on a bottom surface of the first cap substrate 120*a*, and between the first device substrate 210*a* and the first cap substrate 120*a*. The bonding dielectric layer 220*a* and the first device substrate 210*a* enclose the first cavity 122*a* and the vent hole 124. The height of the first cavity 122*a* is greater than the height of the vent hole 124.

A conductive layer 222*a* is disposed on a top surface of the first cap substrate 120*a*, which can be a patterned conductive layer electrically coupled to the first MEMS device 214 and/or the conductive interconnect lines and vias in the interconnect layer 204.

The first sealing layer 140*a* is disposed on the sidewalls of the first cap substrate 120*a*, or further disposed on the sidewalls of the first device substrate 210*a*. A portion of the first sealing layer 140*a* can be filled into the vent hole 124, and the portion of first sealing layer 140*a* can have an end surface 142 close to the first cavity 122*a*. In some embodiments, the end surface 142 of the first sealing layer 140*a* is disposed in the vent hole 124 and does not extend into the first cavity 122*a*. In other words, the end surface 142 of the first sealing layer 140*a* is laterally (e.g. in an x-direction) spaced apart from the first cavity 122*a*. In some embodiments, a portion of the first sealing layer 140*a* can be filled into a first gap 134*a* between the interconnect layer 204 and the first device substrate 210*a*.

The second device substrate 210*b* includes the second MEMS device 216 such has an accelerometer or a gyroscope, and the type of the second MEMS device 216 is different from the type of the first MEMS device 214. For example, in a case where the first MEMS device 214 is a gyroscope which is enclosed in a cavity with relatively low pressure, the second MEMS device 216 may be an accelerometer, instead of the gyroscope, which is enclosed in a cavity with relatively high pressure. The second device substrate 210*b* can be bonded to the base substrate 102 by the bonding material 212 disposed under the protrusion 130*b*. The bonding material 212 can include eutectic bonding material including Au—Ge, Au—Si, Al—Ge, Al—Si or a combination thereof, but not limited thereto. A second lower cavity 132*b* can be defined by the protrusion 130*b*, which is disposed under the second MEMS device 216 and surrounded by the protrusion 130*b*.

The second cap substrate 120*b* is disposed over the second device substrate 210*b*. In some embodiments, the second cap substrate 120*b* can be bonded to the second device substrate 210*b* by a bonding dielectric layer 220*b* disposed on the surface of the second cap substrate 120*b*. The bonding dielectric layer 220*b* can be a conformal layer disposed on a bottom surface of the second cap substrate 120*b*, and between the second device substrate 210*b* and the second cap substrate 120*b*. The bonding dielectric layer 220*b* and the second device substrate 210*b* enclose the second cavity 122*b*. The height of the second cavity 122*b* is greater than the height of the vent hole 124.

A conductive layer 222*b* is disposed on a top surface of the second cap substrate 120*b*, which can be a patterned conductive layer electrically coupled to the second MEMS device 216 and/or the conductive interconnect lines and vias in the interconnect layer 204.

The second sealing layer 140*b* is disposed on the sidewalls of the second cap substrate 120*b*, or further disposed on the sidewalls of the second device substrate 210*b*. In some embodiments, a portion of the second sealing layer 140*b* can be filled into a second gap 134*b* between the interconnect layer 204 and the second device substrate 210*b*. In some embodiments, the second sealing layer 140*b* has the same composition as the first sealing layer 140*a*, and both can be formed concurrently by the same deposition and etching processes.

According to some embodiments of the present disclosure, the first cavity 122*a* has a predetermined pressure such as a first pressure (or a first gas pressure) different from a predetermined pressure of the second cavity 122*b* such as a second pressure (or a second gas pressure). By flowing a gas into or out of the first cavity 122*a* through the vent hole 124, the pressure of the first cavity 122*a* can be controlled independent of the pressure of the second cavity 122*b*. In a case where the first MEMS device needs to operate at a relatively high pressure such as a pressure higher than or equal to 1.0 standard atmosphere (atm), and the second MEMS device needs to operate at a relatively low pressure such as a pressure lower than 1.0 atm, gas can flow from the ambient environment into the first cavity 122*a* through the vent hole 124. The vent hole 124 is hermetically sealed by the first sealing layer 140*a* when the pressure of the first cavity 122*a* is substantially equal to the pressure of the ambient environment.

Figure 3:
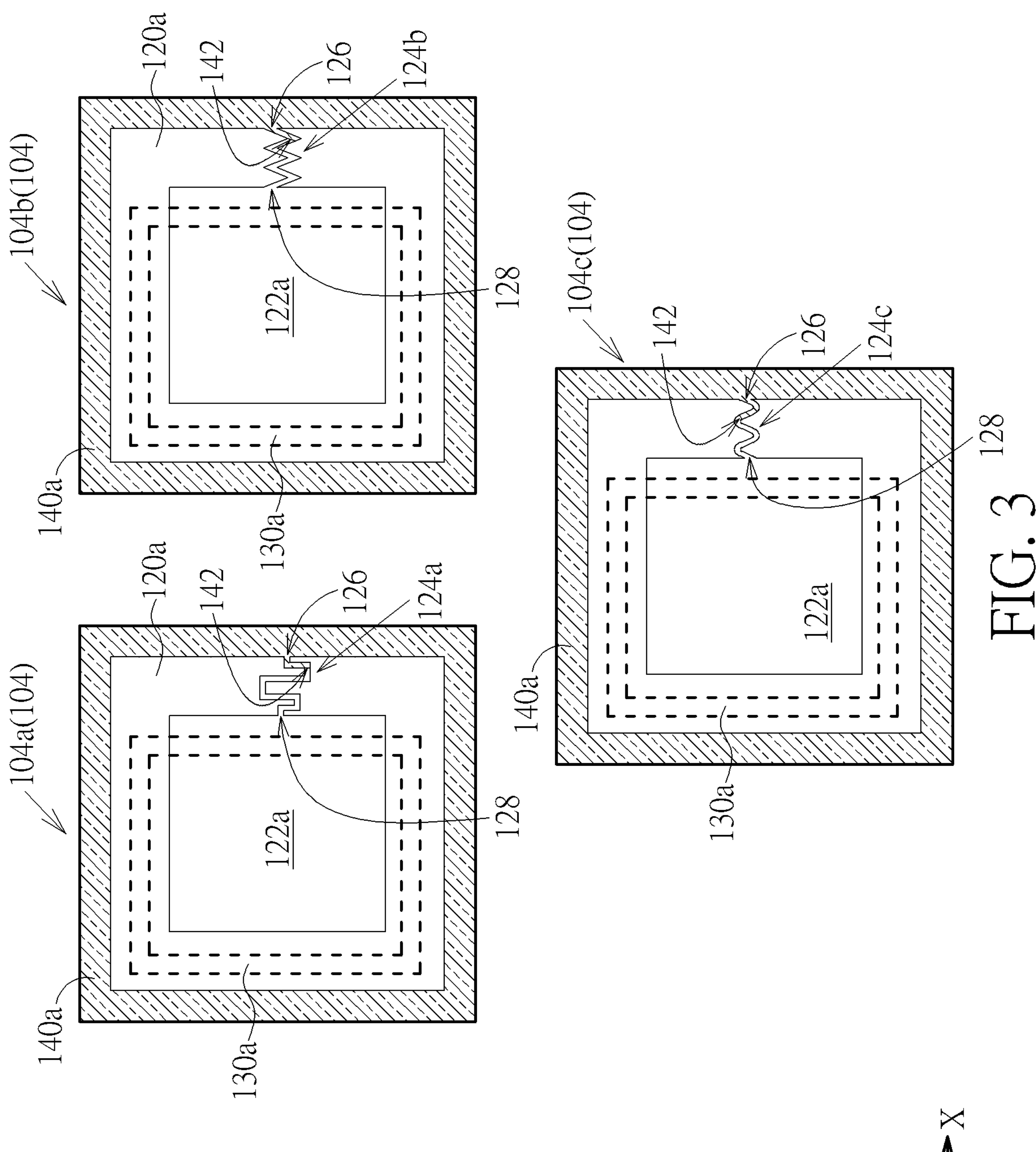
FIG. 3 is a schematic top view illustrating different types of vent holes in a first MEMS package according to some embodiments of the present disclosure.

FIG. 3 is a schematic top view illustrating different types of vent holes in a first MEMS package according to some embodiments of the present disclosure. Referring to FIG. 3, the vent hole in the first MEMS package 104 is not limited to the vent hole in a straight shape as shown in FIG. 1, and can be in different types such as a vent hole 124*a*, 124*b*, 124*c* shown in FIG. 3.

For the vent hole 124*a* of a first MEMS package 104*a*, the vent hole 124*a* includes an outer opening 126 away from the first cavity 122*a* and an inner opening 128 close to the first cavity 122*a*. In this case, the vent hole 124*a* is not in a straight shape but a non-linear shape including several channels extending in an X-direction or a Y-direction and connected with each other through their ends. During the formation of the first sealing layer 140*a*, the end surface 142 of the first sealing layer can be controlled to be terminated in the vent hole 124*a* readily since the vent hole 124*a*, consisting of the channels perpendicular to each other, can prevent the solid products being produced from entering the first cavity 122*a*.

For the vent hole 124*b* of a first MEMS package 104*b*, the vent hole 124*b* is not in a straight shape but in a non-linear shape such as zigzag in shape. During the formation of the first sealing layer 140*a*, the end surface 142 of the first sealing layer can be controlled to be terminated in the vent hole 124*b* readily since the vent hole 124*b* in a zigzag shape can prevent the solid products being produced from entering the first cavity 122*a*.

For the vent hole 124*c* of a first MEMS package 104*c*, the vent hole 124*c* is not in a straight shape but a non-linear shape such as a wave in shape. During the formation of the first sealing layer 140*a*, the end surface 142 of the first sealing layer can be controlled to be terminated in the vent hole 124*c* readily since the vent hole 124*c* in a wave shape can prevent the solid products being produced from entering the first cavity 122*a*.

In order to enable one of ordinary skill in the art to implement the present disclosure, a method of fabricating a semiconductor device of the present disclosure is further described below.

FIG. 4 to FIG. 10 are schematic cross-sectional views illustrating various stages of manufacture of a method of manufacturing a MEMS package according to some embodiments of the present disclosure.

Figure 4:
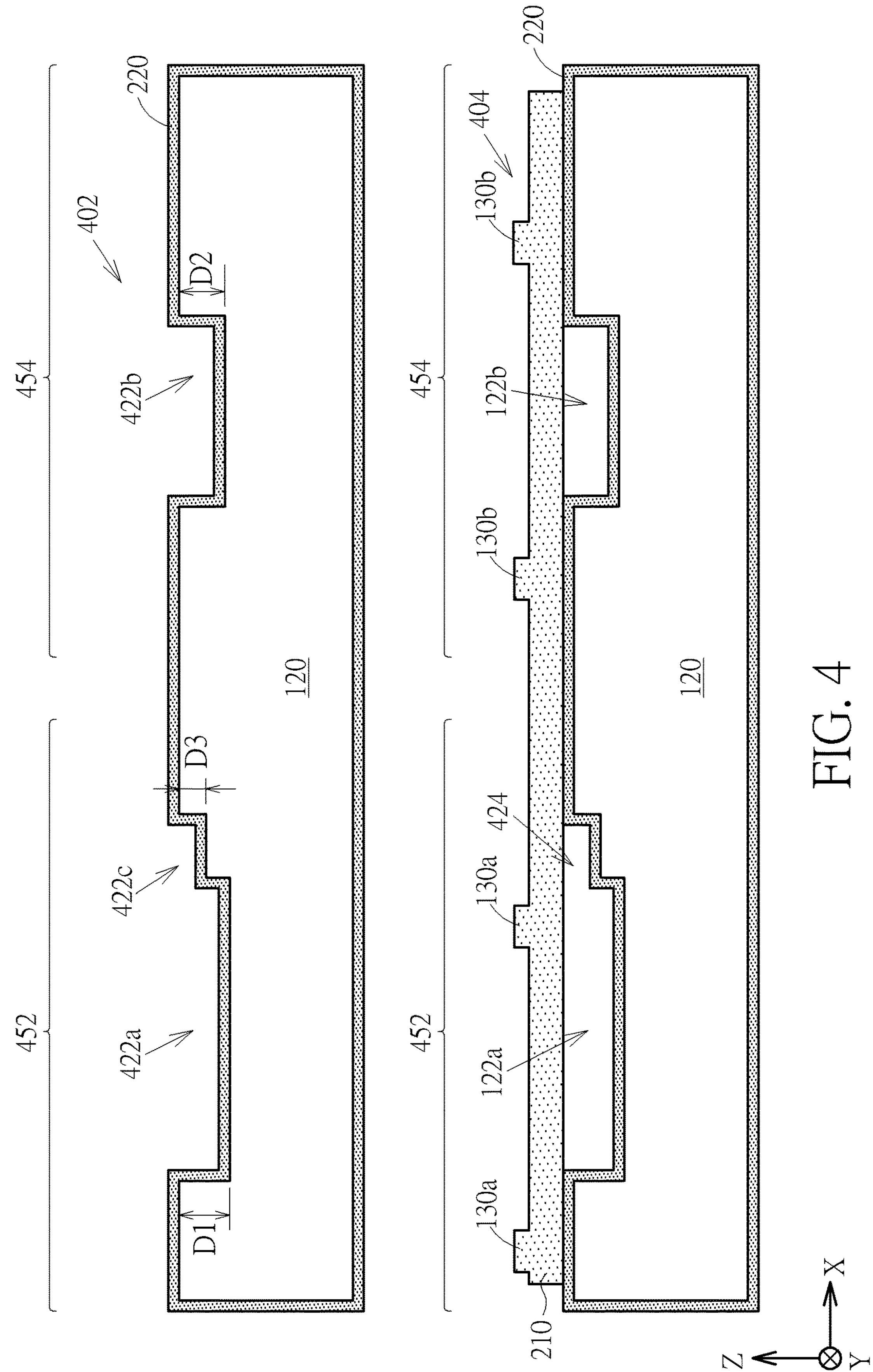
FIG. 4 to FIG. 10 are schematic cross-sectional views illustrating various stages of manufacture of a method of manufacturing a MEMS package according to some embodiments of the present disclosure.

Referring to FIG. 4, at step 402, a cap substrate 120 is provided. The cap substrate 120 can be a semiconductor substrate or an insulating substrate, but not limited thereto. By performing photolithography and etching processes, a plurality of recesses, such as a first recess 422*a*, a second recess 422*b* and a third recess 422*c*, can be formed on a top surface of the cap substrate 120. The first and third recesses 422*a*, 422*c* are in a first region 452 and connected with each other, and the second recess 422*b* is in a second region 454 and laterally (e.g. in a X-direction) spaced apart from the first and third recesses 422*a*. In some embodiments, the first recess 422*a*, the second recess 422*b*, and the third recess 422*c* have a first depth D1, a second depth D2 and a third depth D3 in a Z-direction. The first and second depths D1, D2 are greater than the third depth D3. The dimensions of the first recess 422*a* and the second recess 422*b* in a Y-direction are greater than, such as more than twice, the dimension of the third recess 422*c* in a Y-direction. A bonding dielectric layer 220 is formed on the top surface of the cap substrate 120, and conformally covers the sidewalls and the bottom surfaces of the first to third recess 422*a*, 422*b* 422*c*. In some embodiments, the bonding dielectric layer 220 can wrap around the entire cap substrate 120, which can be formed by a thermal oxidation process or deposition process.

Referring to FIG. 4, at step 404, a bonding process such as a wafer bonding process can be performed to bond a device layer 210 to the cap substrate 120 through the bonding dielectric layer 220, and a bonding dielectric layer can be disposed between the device substrate 210 and the cap substrate 120. By performing the bonding process, the first recess 422*a*, the second recess 422*b*, and the third recess 422*c* can be covered with the device layer 210 to become a first cavity 122*a*, a second cavity 122*b*, and a third cavity 424. The first cavity 122*a*, the second cavity 122*b*, and the third cavity 424 can have a predetermined pressure by controlling an ambient pressure (e.g. a chamber pressure) in the bonding process. For example, for the bonding process performing in a chamber having a chamber pressure of $10^{-5}$ to 5 atm, the first cavity 122*a*, the second cavity 122*b*, and the third cavity 424 can also have a pressure equal to the chamber pressure in the bonding process.

Then, a patterning process can be performed to form protrusions, such as first protrusions 130*a* and second protrusions 130*b* as shown in step 404, which extend from the bulk of the device substrate 210. In some embodiments, the first protrusions 130*a* and second protrusions 130*b* are formed by performing a photolithography and etching process, so the first protrusions 130*a* and second protrusions 130*b* can be integral to the device substrate 210.

Figure 5:
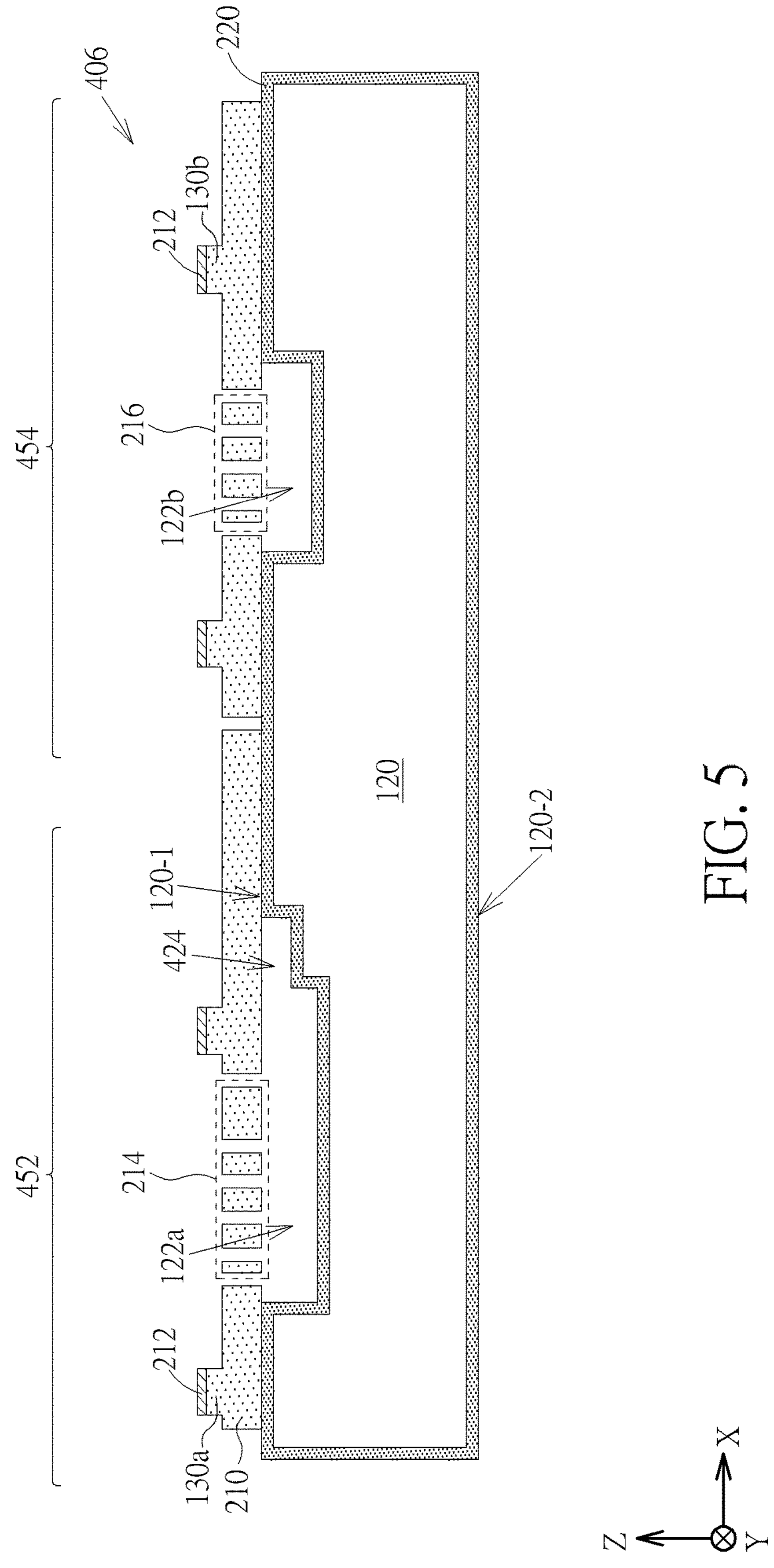

Referring to FIG. 5, at step 406, a first MEMS device 214 and a second MEMS device 216 can be fabricated in the device substrate 210. The first MEMS device 214 and the second MEMS device 216 can be part of an inertial measurement unit (IMU), and can be constituted by movable proof masses, movable suspension beams, movable suspension rings or a combination thereof, but not limited thereto. In some embodiments, the type of the first MEMS device 214 is different from the second MEMS device 216. For example, the first MEMS device 214 may be an accelerometer which needs to operate at a relatively high pressure such as a pressure higher than or equal to 1.0 standard atmosphere (atm), and the second MEMS device may be a gyroscope which needs to operate at relatively low pressure such as a pressure lower than 1.0 atm. Then, a bonding material 212 such as eutectic bonding material of Au—Ge, Au—Si, Al—Ge, Al—Si or a combination thereof is formed on the protrusions 130*a*, 130*b*.

Figure 6:
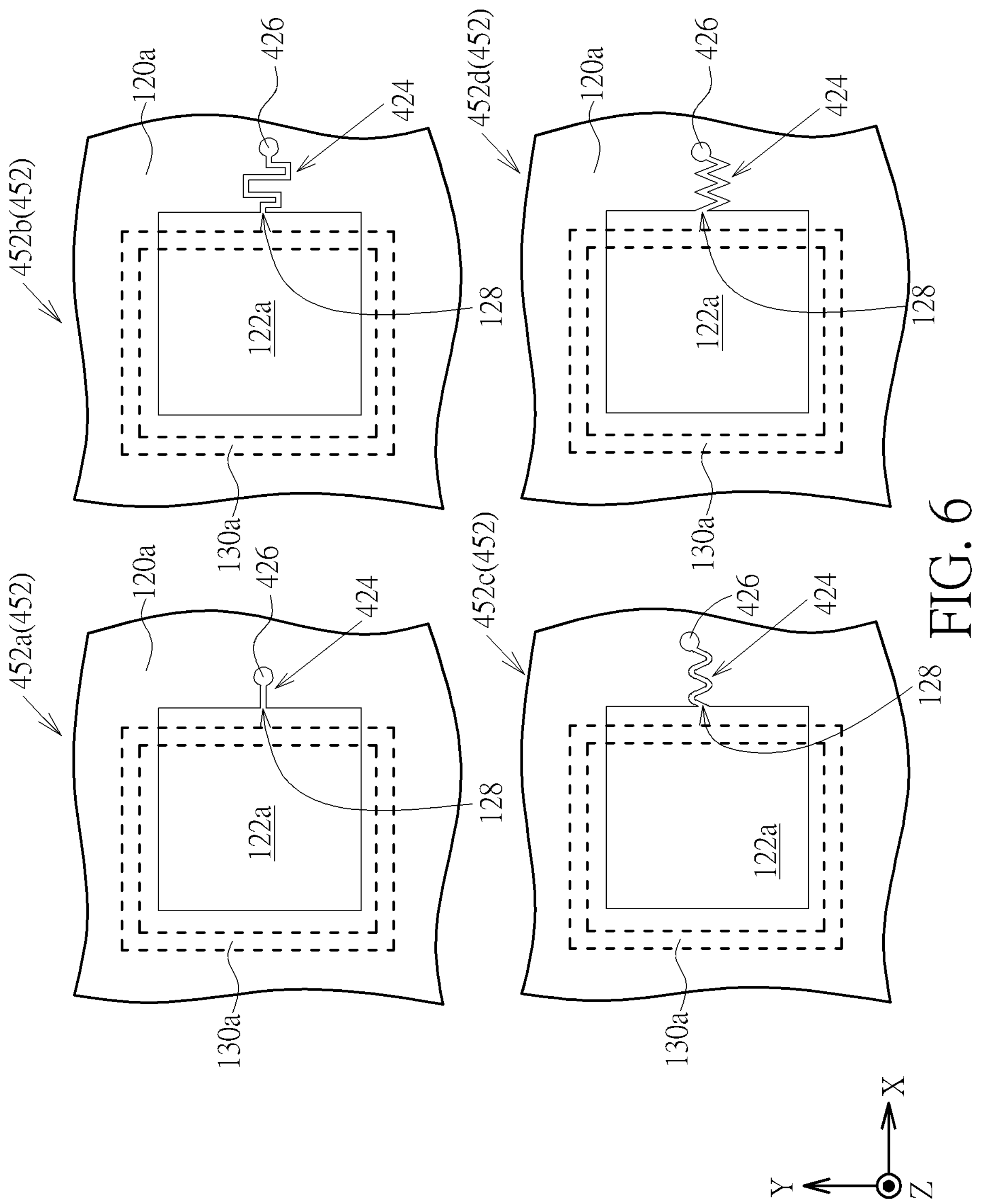

FIG. 6 is a schematic top view illustrating different types of third cavities 424 in a first region 452 according to some embodiments of the present disclosure. Referring to FIG. 6, in a first region 452*a*, the third cavity 424 is in a straight shape with a round end 426 away from the first cavity 122*a* and covered with the cap substrate 120*a*. In addition to the straight third cavity 424, the third cavity can have other shapes as shown in respective first region 452*b*, 452*b*, 452*c*, 452*d*.

For the third cavity 424 in the first region 452*b*, the third cavity 424 is not in a straight shape but a non-linear shape including several channels connected with and perpendicular to each other. For the third cavity 424 in the first region 452*c*, the third cavity 424 is not in a straight shape but a non-linear shape such as a wave in shape. For the third cavity 424 in the first region 452*d*, the third cavity 424 is not in a straight shape but a non-linear shape such as zigzag in shape.

Figure 7:
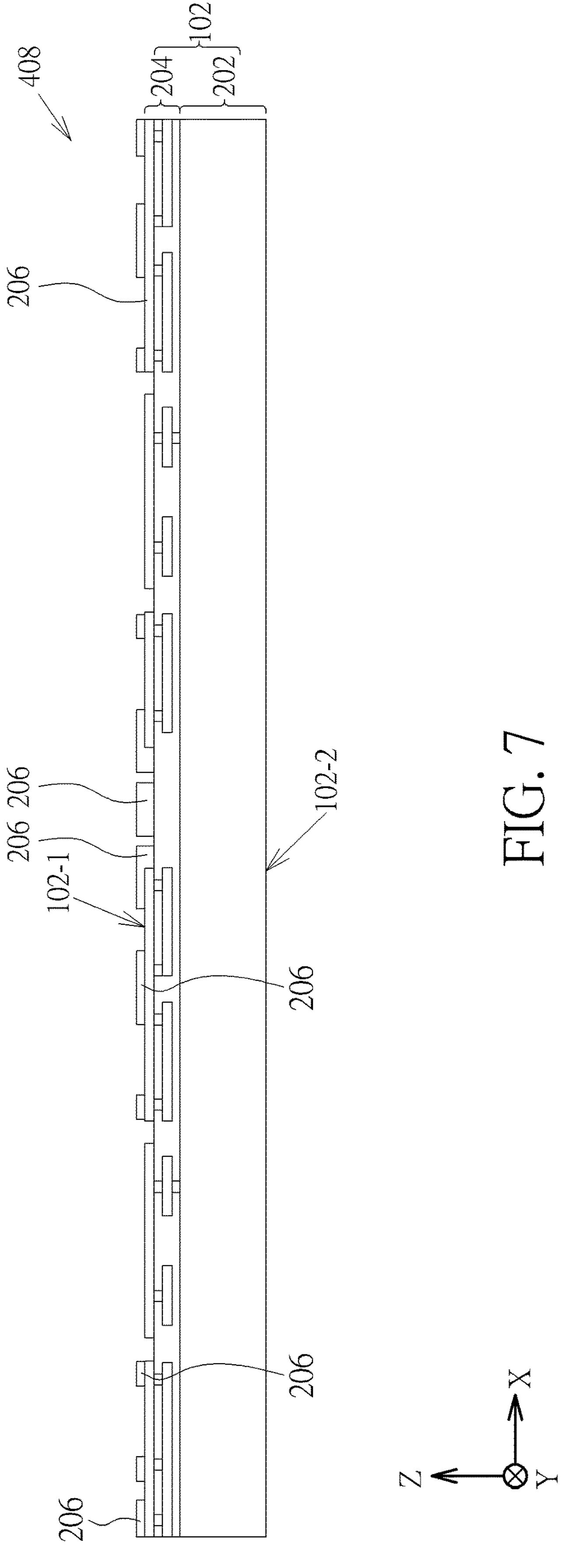

Referring to FIG. 7, at step 408, a base substrate 102 is provided. In some embodiments, the base substrate 102 include a supporting substrate 202 and an interconnect layer 204 disposed on the supporting substrate 202. In some embodiments, the supporting substrate 202 is a semiconductor substrate used to accommodate semiconductor devices such as transistors, but not limited thereto. In some embodiments, the supporting substrate 202 can be an insulating substrate without any transistors. The interconnect layer 204 includes layers of inter metal dielectric (IMD) and a plurality of conductive interconnect lines and vias. The conductive interconnect lines and vias have a predetermined design layout, and can be electrically coupled to the first MEMS device 212 and the second MEMS device 216 disposed over the interconnect layer 204. A protection layer 206 can be disposed on the interconnect layer 204 to protect portions of the interconnect layer 204. The base substrate 102 has two opposite sides, such as a front side 102-1 and a back side 102-2. In the subsequent process, a front side 102-1 can face and be bonded to the device substrate.

Figure 8:
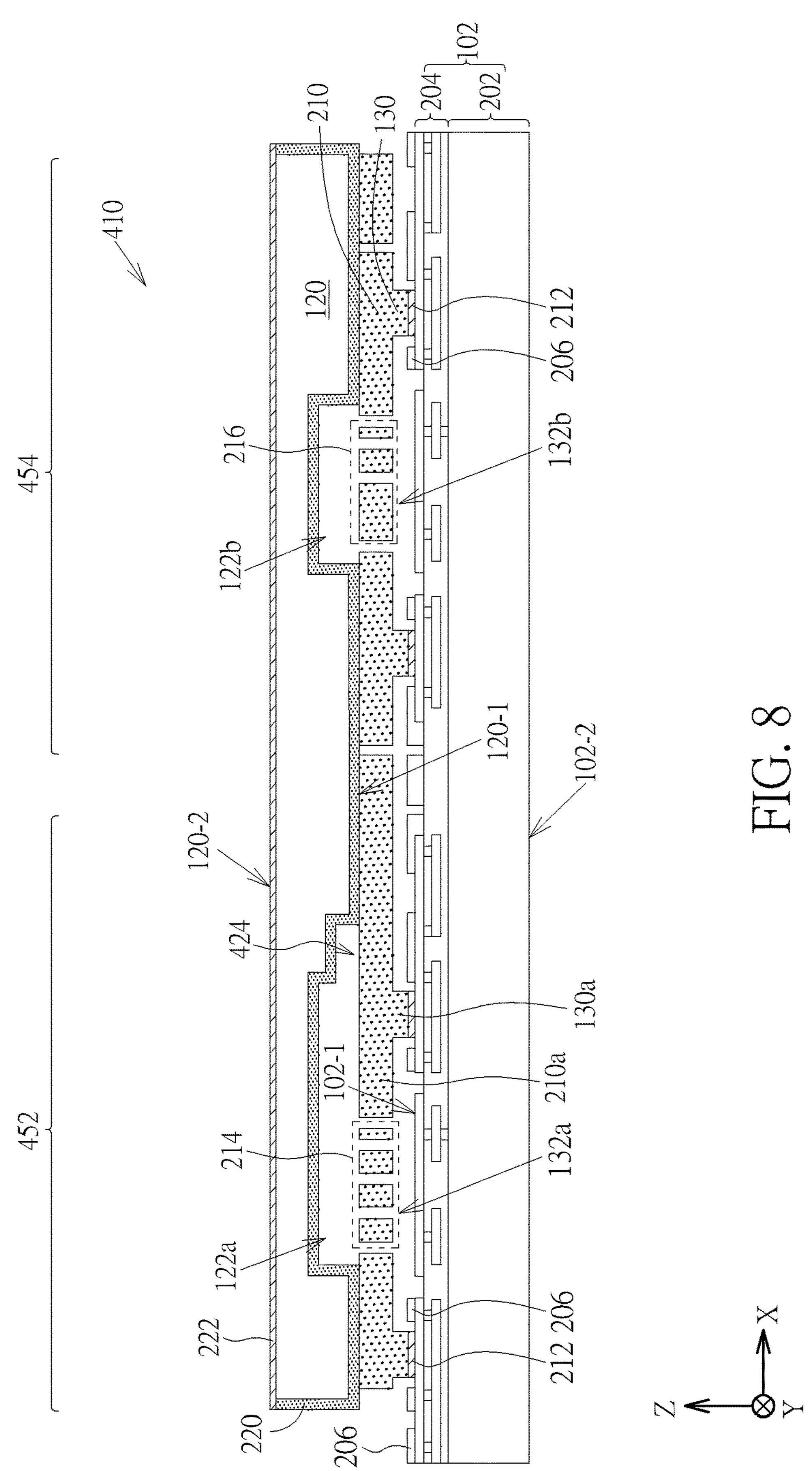

Referring to FIG. 8, at step 410, the base substrate 102 is bonded to the device substrate 210 through the bonding material 212. By performing the bonding process, a first lower cavity 132*a* can be formed between the device substrate 210 and the base substrate 102 in the first region 452. In this way, at least a portion of the first MEMS device 214 can move, vibrate, or rotate in a space constituted by the first lower cavity 132*a* and the first cavity 122*a* during operation. Besides, by performing the bonding process, a second lower cavity 132*b* can be formed between the device substrate 210 and the base substrate 102 in the second package region 454. In this way, at least a portion of the second MEMS device 216 can move, vibrate, or rotate in a space constituted by the second lower cavity 132*ba* and the second cavity 122*b* during operation.

After the bonding process, the cap substrate 120 can be thinned down to a predetermined thickness. Then, a conductive layer 222 such as a metal layer can be disposed on the top surface of the cap substrate 222. The conductive layer 222 can be further patterned in the subsequent patterning process and electrically coupled to the first MEMS device 214, the second MEMS device 216, the interconnect layer 204 or a combination thereof. Optional conductive vias (not shown) can be formed in the cap substrate 120 and/or the device substrate 210, which is configured to transmit electrical signals into or out of the first MEMS device 214 and the second MEMS device 216.

Figure 9:
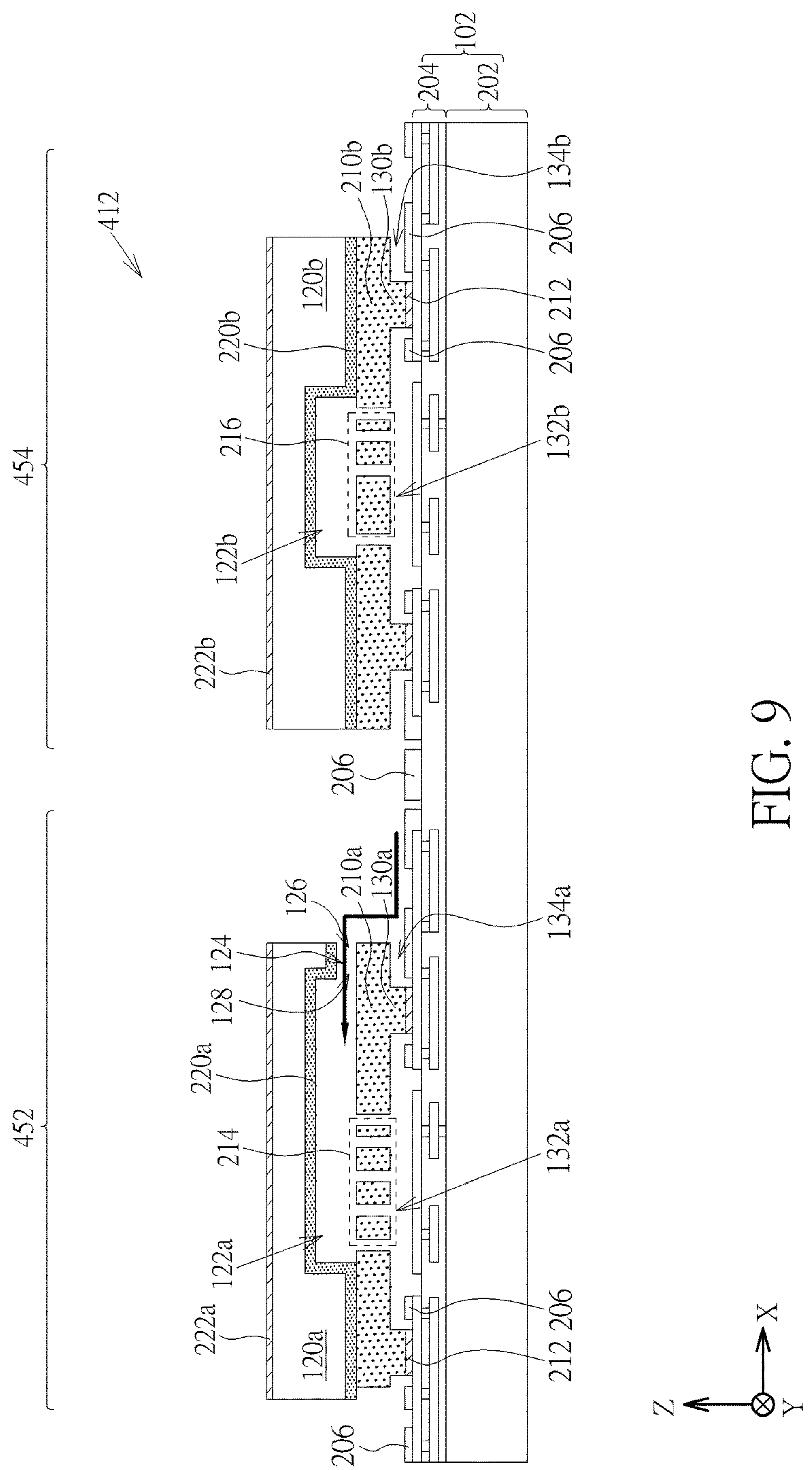

Referring to FIG. 8 and FIG. 9, at step 412, the cap substrate 120 at the boundary of the first region 452 and the second region 454 is removed by etching, saw cutting or laser cutting. In some embodiments, the conductive layer 222, the bonding dielectric layer 220, the device substrate 210*b* at the boundary of the first region 452 and the second region 454 can also be removed concurrently. During the removing process, the cap substrate 120 abutting an end of the third recess 424 can be removed. Besides, the round end 426 of the third recess 424 as shown in FIG. 6 can be removed to obtain a vent hole 124 between a bonding dielectric layer 220*a* and a first device substrate 210*a*. The vent hole 124 includes an outer opening 126 connected to an ambient environment and an inner opening 128 connected to the first cavity 122*a*. The pressure of the first cavity 122*a* can be controlled by flowing gas in the ambient environment into or out of the first cavity 122*a* through the vent hole 124. In this way, the pressure of the first cavity 122*a* can be equal to the ambient pressure.

Figure 10:
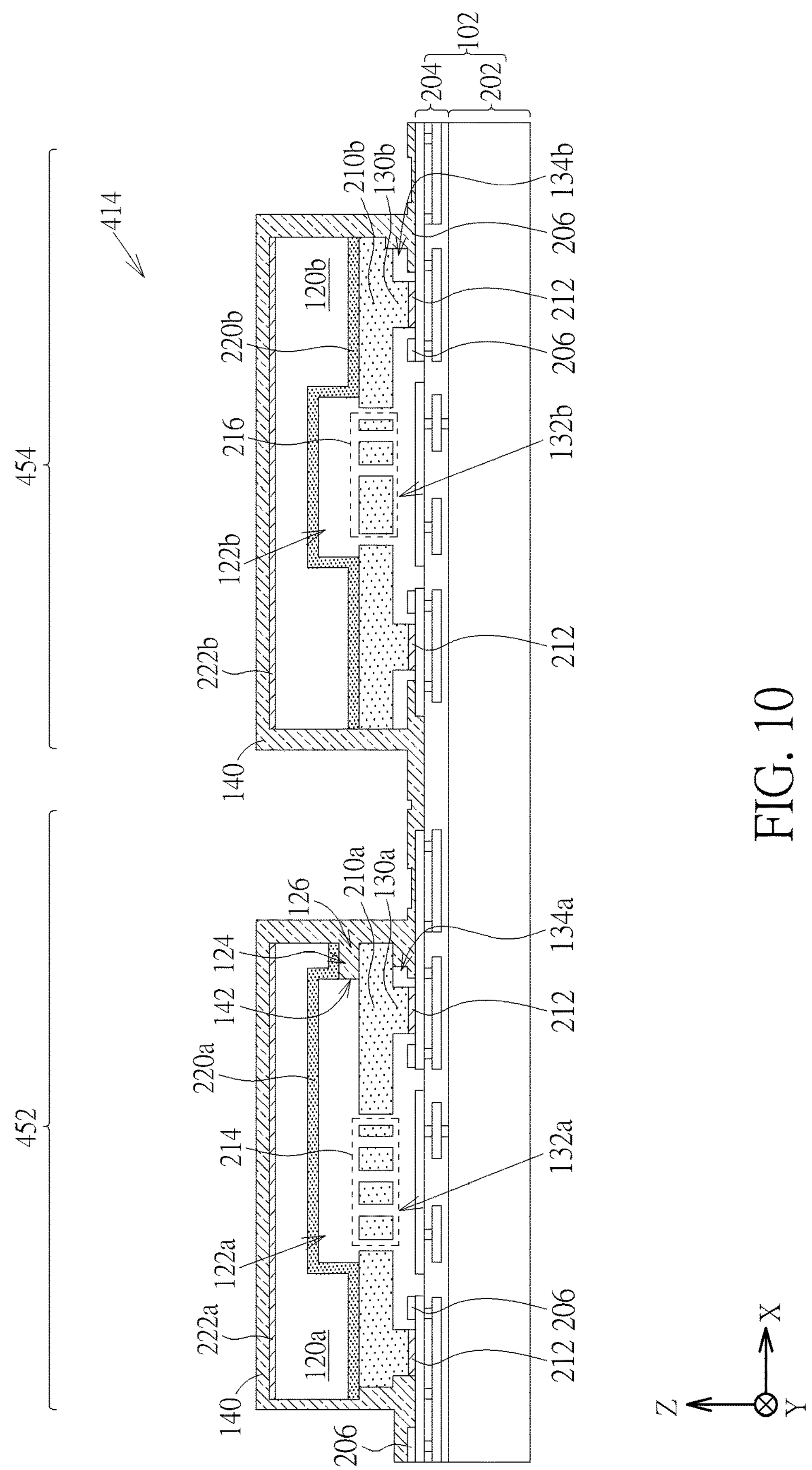

Referring to FIG. 10, at step 414, a sealing layer 140 is formed to hermetically seal the vent hole 124. In some embodiments, the sealing layer 140 can be a blanket layer covering all the components or parts over the base substrate 102. Thus, the sealing layer 140 can cover the sidewalls of the first and second cap substrates 120*a*, 120*b*, and the sidewalls of the first and second device substrates 210*a*, 210*b*. During the process of forming the sealing layer 140, the pressure of the first cavity 122*a* is affected by the ambient pressure (e.g. chamber pressure) of the deposition chamber. In some embodiments, the pressure of the first cavity 122*a* can be substantially equal to the chamber pressure of the deposition chamber. However, once the vent hole 124 is hermetically sealed by the sealing layer 140, the pressure of the first cavity 122*a* would no longer be affected by the chamber pressure of the deposition chamber.

Subsequently, after step 414, other processes such as an etching process can be performed to obtain the MEMS package 100 as shown in FIG. 2. By performing the etching process, the conductive layers 222*a*, 222*b* can be exposed and the first sealing layer 140*a* and the second sealing layer 140*b* can be respectively formed on the sidewalls of the first and second cap substrates 120*a*, 120*b*, and the sidewalls of the first and second device substrates 210*a*, 210*b*. In some embodiments, the first sealing layer 140*a* and the second sealing layer 140*b* are self-aligned structures which can be obtained without performing photolithography process.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A microelectromechanical systems (MEMS) package, comprising:

a first MEMS package, comprising:

a first device substrate comprising a first MEMS device;

a first cap substrate bonded to the first device substrate, wherein the first cap substrate encloses a first cavity and a vent hole, the vent hole being connected to the first cavity; and a first sealing layer laterally extending into and filled in at least a portion of the vent hole, wherein the first sealing layer is disposed between a top surface of the first device substrate and a bottom surface of the first cap substrate;

a second MEMS package laterally spaced apart from the first MEMS package, comprising:

a second device substrate comprising a second MEMS device; and a second cap substrate bonded to the second device substrate, wherein the second cap substrate encloses a second cavity, wherein the first cavity has a first pressure, and the second cavity have a second pressure different from the first pressure.

2. The MEMS package of claim 1, wherein the first MEMS device comprises an accelerometer, and the second MEMS device comprises an gyroscope, the first pressure being greater than the second pressure.

3. The MEMS package of claim 1, wherein a height of the first cavity is greater than a height of the vent hole.

4. The MEMS package of claim 1, wherein the vent hole is in a non-linear shape or a straight shape when viewed from a top-down perspective.

5. The MEMS package of claim 4, wherein the non-linear shape comprises a wave shape or a zigzag.

6. The MEMS package of claim 1, wherein the first sealing layer comprises an end surface in the vent hole, the end surface of the first sealing layer being spaced apart from the first cavity.

7. The MEMS package of claim 1, wherein the first sealing layer further covers a sidewall of the first device substrate and a sidewall of the first cap substrate.

8. The MEMS package of claim 1, wherein the first MEMS package further comprises a bonding dielectric layer disposed between the first device substrate and the first cap substrate, the bonding dielectric layer being enclosing the first cavity and the vent hole.

9. The MEMS package of claim 1, wherein the first device substrate further comprises a protrusion being extending downward, a portion of the protruding portion overlapping the first cavity and laterally spaced apart from the first vent hole.

10. The MEMS package of claim 9, wherein the first MEMS package further comprises a first lower cavity surrounding by the protrusion.

11. The MEMS package of claim 1, wherein the first MEMS package further comprises a conductive layer disposed on a top surface of the first cap substrate.

12. The MEMS package of claim 11, wherein the conductive layer is electrically coupled to an interconnect layer disposed under the first device substrate.

13. The MEMS package of claim 1, further comprising an interconnect layer disposed under the first device substrate and the second device substrate, the interconnect layer being bonded to the first device substrate and the second device substrate.

14. The MEMS package of claim 13, wherein the interconnect layer is electrically coupled to the first MEMS device and the second MEMS device.

15. The MEMS package of claim 13, wherein the first sealing layer is further filled in a gap between the interconnect layer and the first device substrate.

16. The MEMS package of claim 1, wherein the second MEMS package further comprises a second sealing layer covering a sidewall of the second device substrate, and the second sealing layer has the same composition as the first sealing layer.

* * * * *